(12) United States Patent
Tan et al.

(10) Patent No.: US 9,666,557 B2
(45) Date of Patent: May 30, 2017

(54) SMALL FOOTPRINT SEMICONDUCTOR PACKAGE

(71) Applicant: Infineon Technologies AG, Neubiberg (DE)

(72) Inventors: Tian San Tan, Melaka (MY); Theng Chao Long, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 389 days.

(21) Appl. No.: 13/905,194

(22) Filed: May 30, 2013

(65) Prior Publication Data

US 2014/0353766 A1    Dec. 4, 2014

(51) Int. Cl.
*H01L 23/34*    (2006.01)
*H01L 25/065*    (2006.01)
(Continued)

(52) U.S. Cl.
CPC .......... *H01L 25/065* (2013.01); *H01L 23/051* (2013.01); *H01L 23/34* (2013.01); *H01L 23/36* (2013.01); *H01L 24/06* (2013.01); *H01L 24/27* (2013.01); *H01L 24/33* (2013.01); *H01L 24/73* (2013.01); *H01L 24/80* (2013.01); *H01L 24/81* (2013.01); *H01L 24/83* (2013.01); *H01L 24/92* (2013.01); *H05K 1/0209* (2013.01); *H05K 1/181* (2013.01); *H01L 24/05* (2013.01); *H01L 24/08* (2013.01); *H01L 24/29* (2013.01); *H01L 24/30* (2013.01); *H01L 24/32* (2013.01); *H01L 2224/04* (2013.01); *H01L 2224/06181* (2013.01); *H01L 2224/06183* (2013.01);
(Continued)

(58) Field of Classification Search
CPC ..... H01L 23/34; H01L 23/3107; H01L 24/81; H01L 25/065; H01L 25/105; H01L 23/00; H01L 23/051; H01L 23/36; H01L 24/06; H01L 24/27; H01L 24/33; H01L 24/73; H01L 24/80; H01L 24/83; H01L 24/92; H05K 1/0209; H05K 1/181
See application file for complete search history.

(56) References Cited

U.S. PATENT DOCUMENTS 6,025,642 A * 2/2000 Burns ........................... 257/686
7,053,474 B2   5/2006 Otremba
(Continued)

*Primary Examiner* — Fazli Erdem
(74) *Attorney, Agent, or Firm* — Murphy, Bilak & Homiller, PLLC

(57) ABSTRACT

A semiconductor assembly includes a substrate with electrically conductive regions and a semiconductor package. The semiconductor package includes a semiconductor die, first and second terminals, and a mold compound. The die has opposing first and second main surfaces, an edge disposed perpendicular to the first and second main surfaces, a first electrode at the first main surface, and a second electrode at the second main surface. The first terminal is attached to the first electrode. The second terminal is attached to the second electrode. The mold compound encloses at least part of the die and the first and second terminals so that each of the terminals has a side parallel with and facing away from the die that remains at least partly uncovered by the mold compound. The first and second terminals of the semiconductor package are connected to different ones of the electrically conductive regions of the substrate.

26 Claims, 11 Drawing Sheets

(51) Int. Cl.
*H01L 23/00* (2006.01)
*H01L 23/051* (2006.01)
*H01L 23/36* (2006.01)
*H05K 1/02* (2006.01)
*H05K 1/18* (2006.01)

(52) U.S. Cl.
CPC ........... *H01L 2224/08237* (2013.01); *H01L 2224/08257* (2013.01); *H01L 2224/293* (2013.01); *H01L 2224/29294* (2013.01); *H01L 2224/30181* (2013.01); *H01L 2224/32245* (2013.01); *H01L 2224/33181* (2013.01); *H01L 2224/73151* (2013.01); *H01L 2224/73251* (2013.01); *H01L 2224/80898* (2013.01); *H01L 2224/83191* (2013.01); *H01L 2224/83815* (2013.01); *H01L 2224/922* (2013.01); *H01L 2224/9221* (2013.01); *H01L 2924/1301* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01); *H01L 2924/15153* (2013.01); *H01L 2924/15159* (2013.01); *H01L 2924/181* (2013.01); *H05K 2201/10166* (2013.01); *H05K 2201/10454* (2013.01); *Y02P 70/611* (2015.11)

(56) References Cited

U.S. PATENT DOCUMENTS

| | | | |
|---|---|---|---|
| 2002/0100963 A1* | 8/2002 | Suzuki et al. | 257/678 |
| 2004/0159927 A1* | 8/2004 | Loo et al. | 257/678 |
| 2004/0212057 A1* | 10/2004 | Otremba | 257/678 |
| 2005/0230795 A1* | 10/2005 | Furuyama et al. | 257/678 |
| 2006/0114693 A1* | 6/2006 | Chou et al. | 362/631 |
| 2006/0270108 A1 | 11/2006 | Farnworth et al. | |
| 2007/0045872 A1 | 3/2007 | Fee | |
| 2007/0138503 A1 | 6/2007 | Germain et al. | |
| 2007/0252169 A1* | 11/2007 | Tokuyama et al. | 257/162 |
| 2009/0178828 A1* | 7/2009 | Tsumura et al. | 174/252 |
| 2010/0314732 A1* | 12/2010 | Li | 257/676 |
| 2011/0316143 A1* | 12/2011 | Noritake | H01L 21/565 257/713 |

* cited by examiner

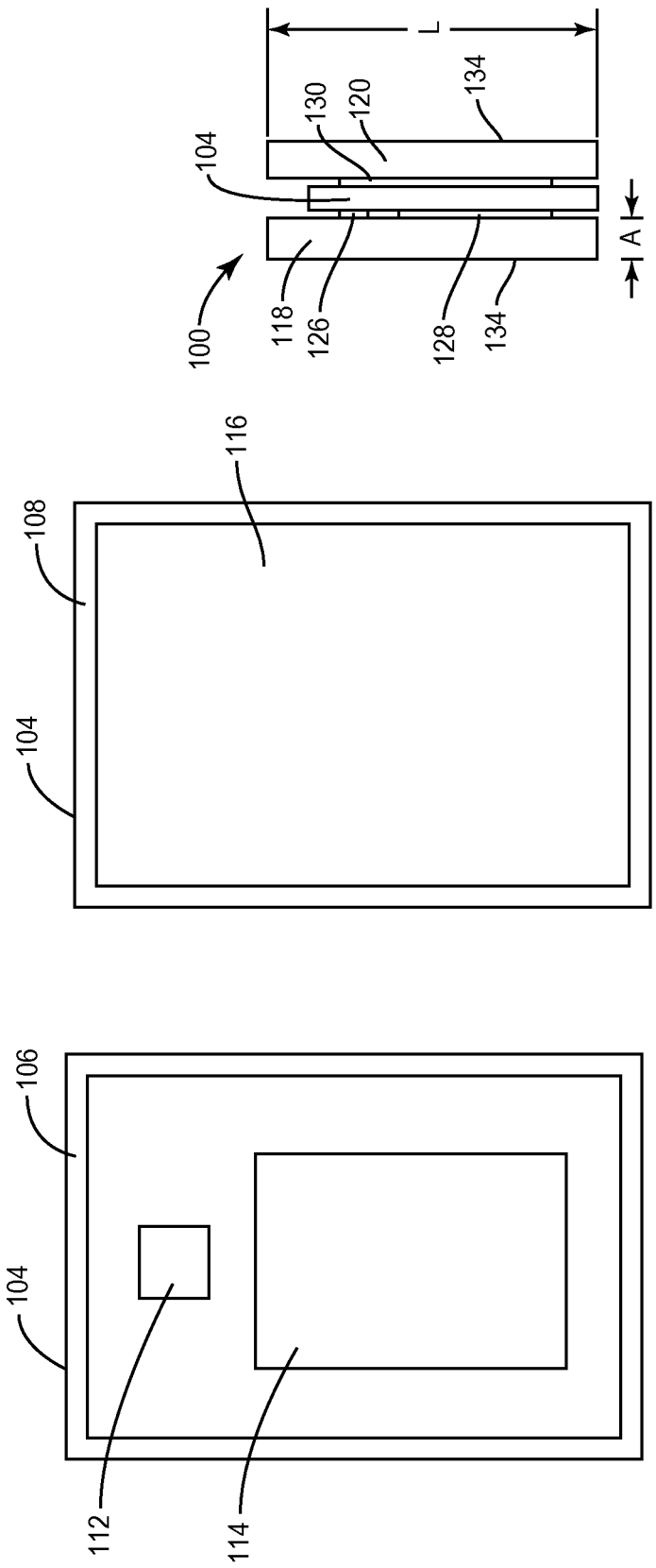

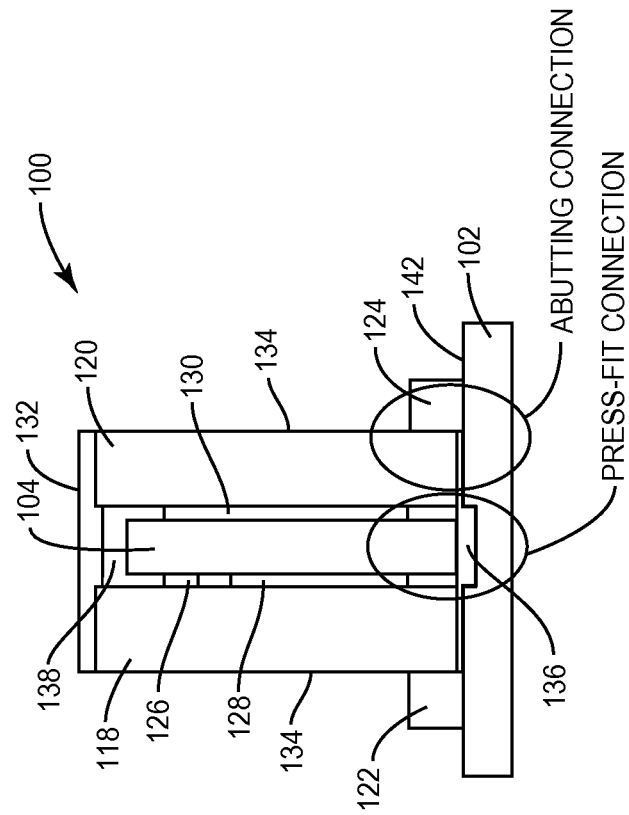
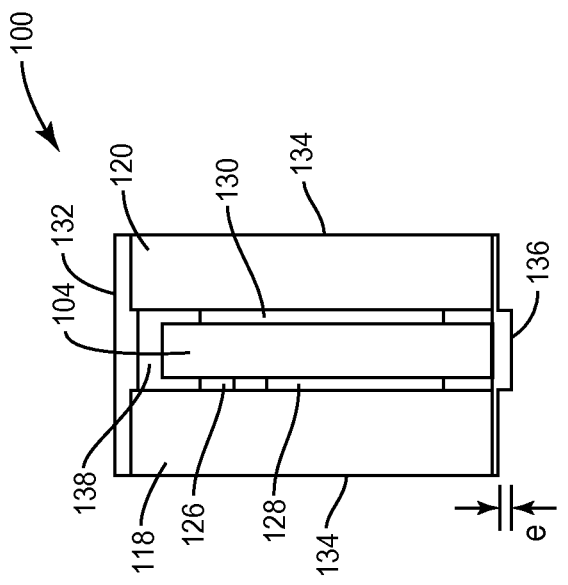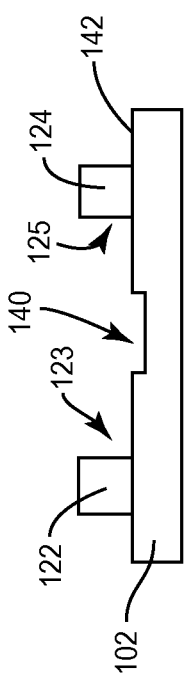

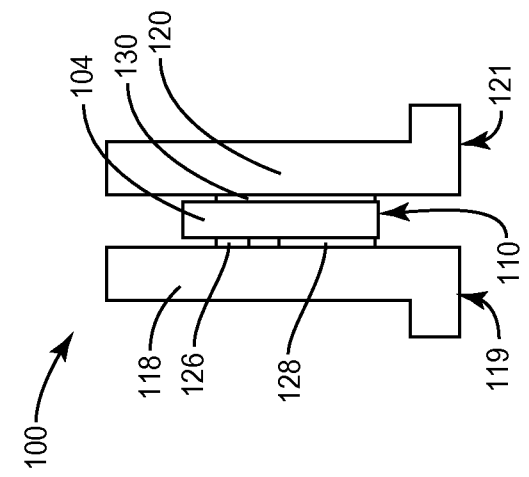
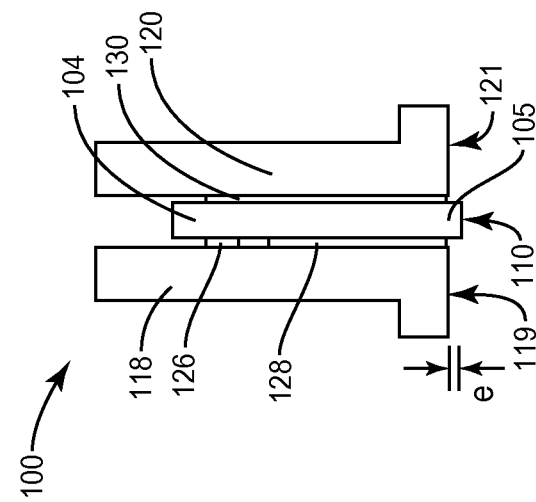
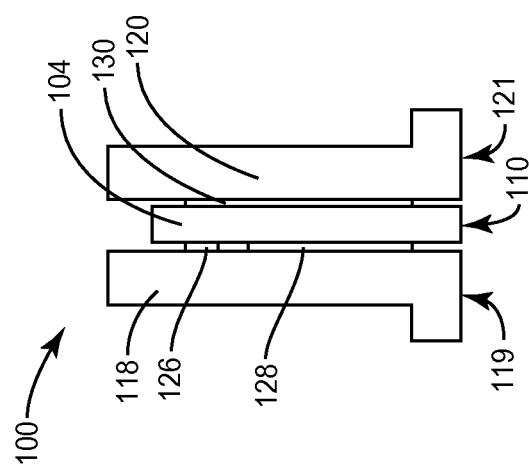

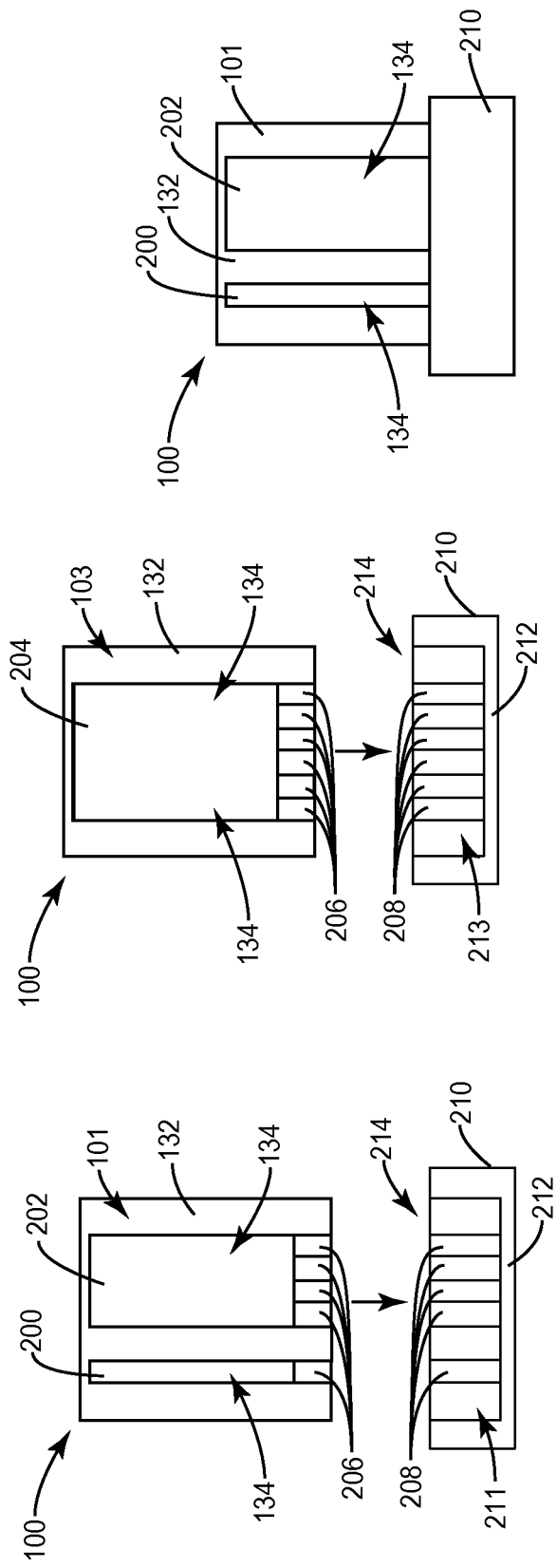

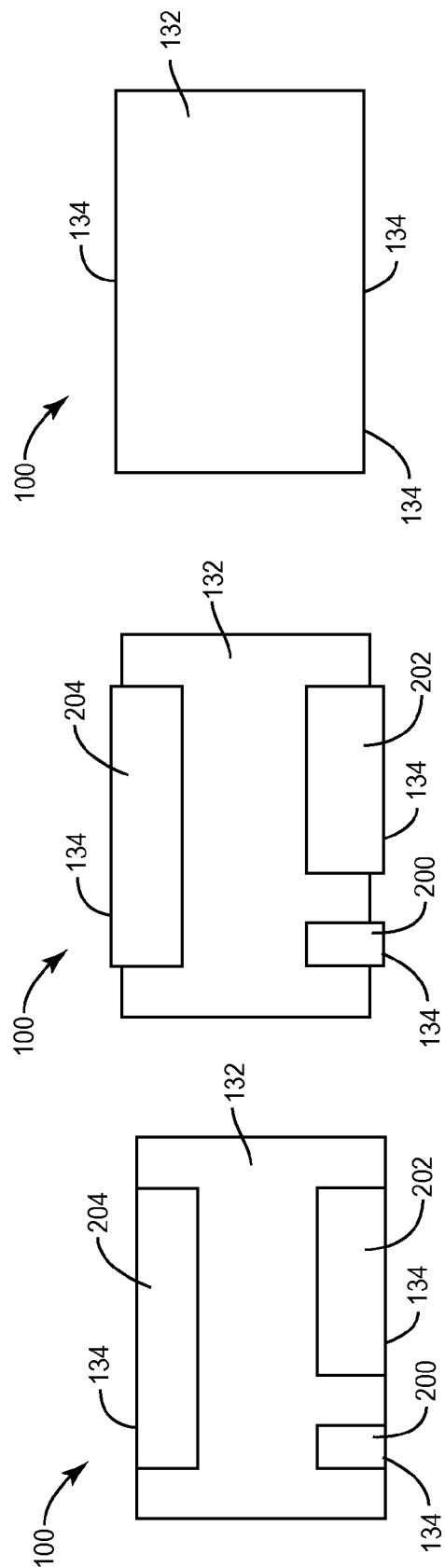

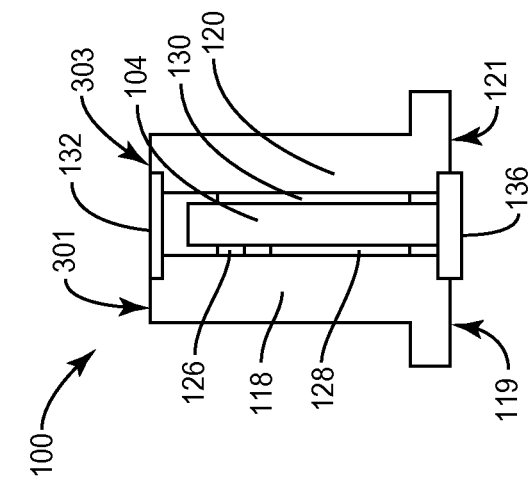
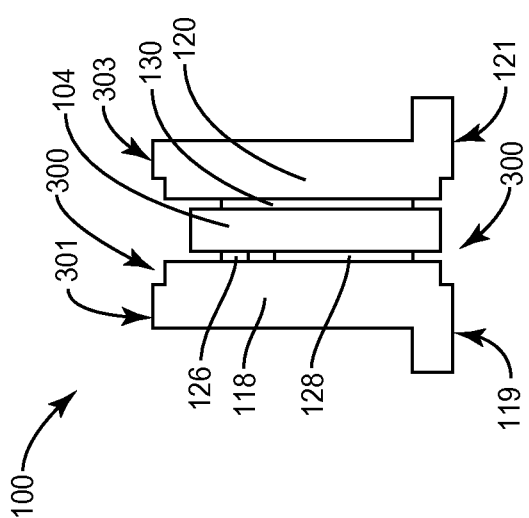

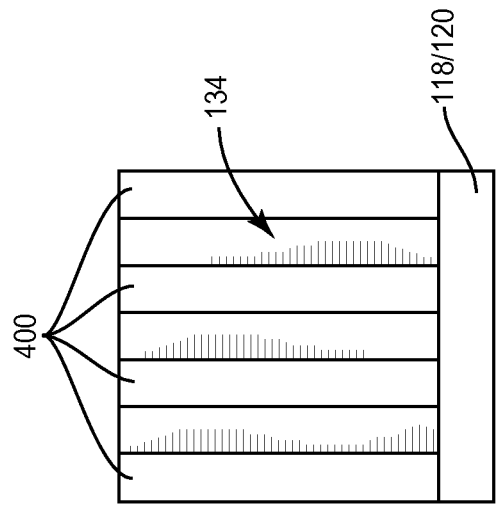
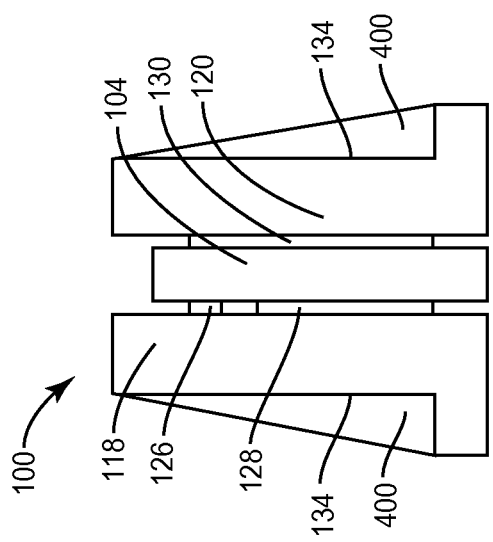
FIG. 9A
FIG. 9B

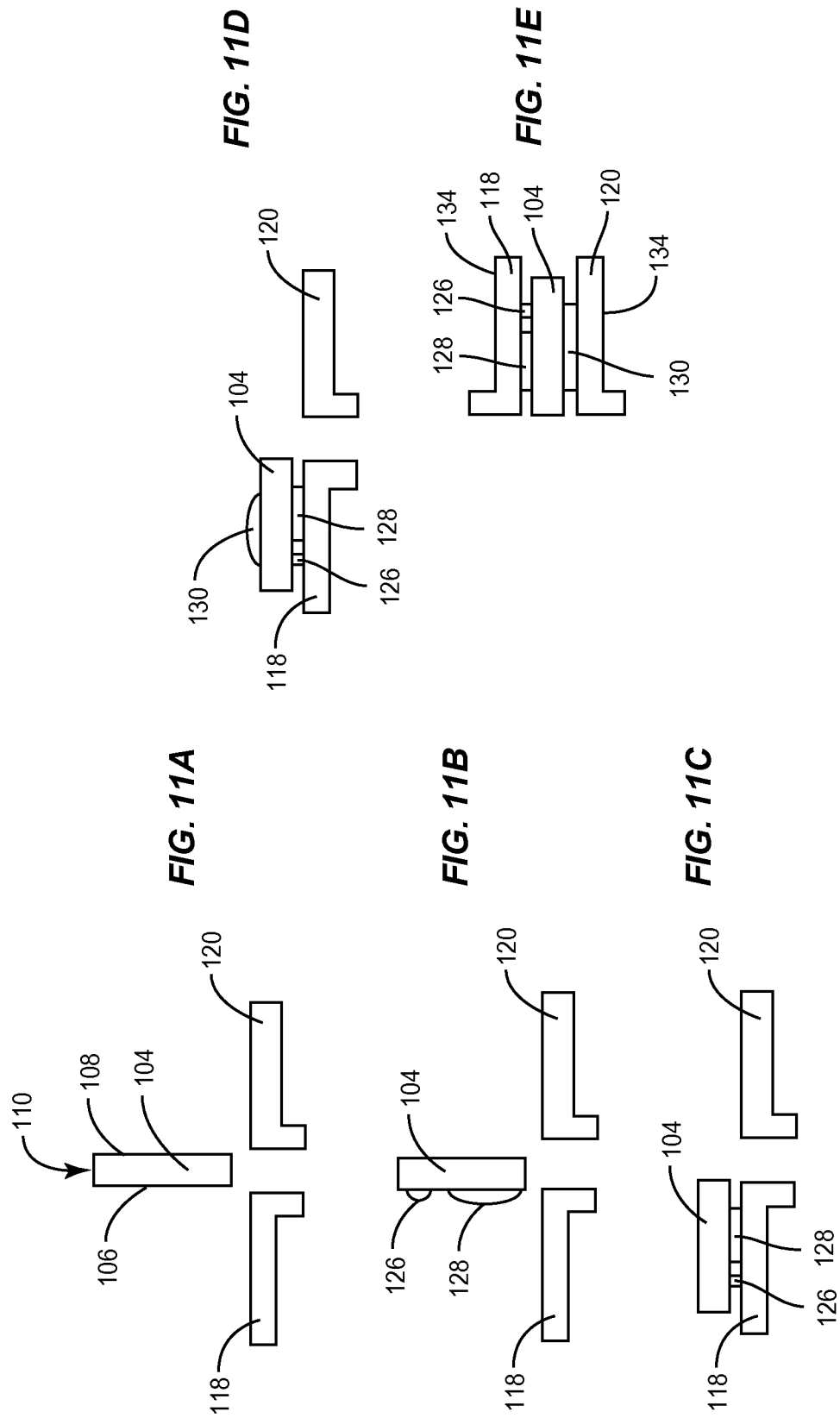

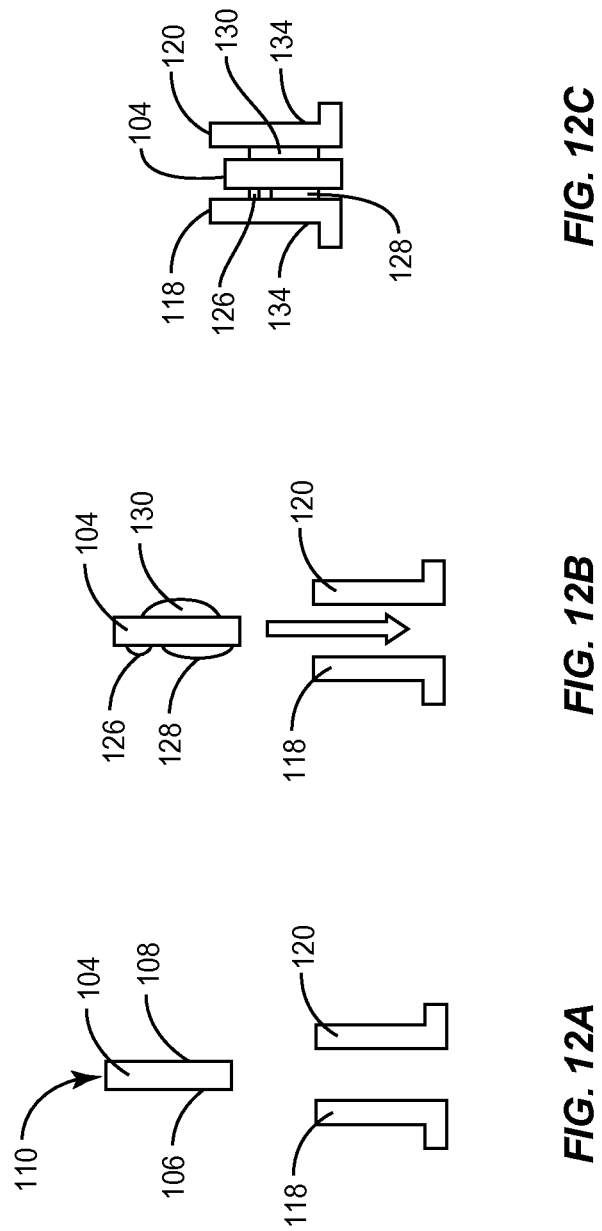

SMALL FOOTPRINT SEMICONDUCTOR PACKAGE

TECHNICAL FIELD

The instant application relates to semiconductor packages, and more particularly to semiconductor packages with small footprints.

BACKGROUND

Conventional high power semiconductor packages with a semiconductor die (chip) require a relatively large PCB (printed circuit board) footprint. Both main surfaces of the die typically have one or more electrodes. The die is attached to a PCB with one main surface facing the PCB and the other main surface facing away from the PCB. Each electrode disposed at the facing surface of the die is attached to a corresponding electrically conductive region of the PCB e.g. in a source-down or drain-down configuration. Metal clips or other connecting elements such as bonding wires or ribbons extend from the PCB to the other main surface of the die to make electrical connection with each electrode disposed at the surface of the die facing away from the PCB. Many 'squares' (i.e. 1 mm square units) are required on the surface of the PCB to accommodate such a source-down or drain-down package configuration, increasing the cost of the package. In addition, heat expelled at the main surface of the die facing the substrate is at least partly dissipated through the PCB/substrate. Conventional PCBs therefore must provide both an electrical and thermal path for components mounted on the PCB, resulting in a high number of components sharing the designed thermal paths of the PCB.

SUMMARY

According to an embodiment of a semiconductor package, the package comprises a semiconductor die having opposing first and second main surfaces, an edge disposed perpendicular to the first and second main surfaces, a first electrode at the first main surface, and a second electrode at the second main surface. The package further comprises a first terminal attached to the first electrode, a second terminal attached to the second electrode, and a mold compound. The mold compound encloses at least part of the semiconductor die and the first and second terminals so that each of the first and second terminals has a side parallel with and facing away from the semiconductor die that remains at least partly uncovered by the mold compound. A protrusion formed from the mold compound or protruding out of the mold compound is disposed between the first and second terminals. The protrusion extends outward further than the first and second terminals at the same side of the semiconductor package.

According to another embodiment of a semiconductor package, the package comprises a semiconductor die having opposing first and second main surfaces, an edge disposed perpendicular to the first and second main surfaces, a first electrode at the first main surface, and a second electrode at the second main surface. The package further comprises a first terminal attached to the first electrode, a second terminal attached to the second electrode, and a mold compound. The mold compound encloses at least part of the semiconductor die and the first and second terminals so that each of the first and second terminals has a side parallel with and facing away from the semiconductor die that remains at least partly uncovered by the mold compound. Cooling structures are patterned into the at least partly uncovered side of at least one of the first and second terminals for increasing the surface area of that side.

According to an embodiment of a semiconductor assembly, the assembly comprises as substrate and a semiconductor package. The substrate has electrically conductive regions. The semiconductor package comprises a semiconductor die having opposing first and second main surfaces, an edge disposed perpendicular to the first and second main surfaces, a first electrode at the first main surface, and a second electrode at the second main surface. The semiconductor package further comprises a first terminal attached to the first electrode, a second terminal attached to the second electrode, and a mold compound enclosing at least part of the semiconductor die and the first and second terminals so that each of the first and second terminals has a side parallel with and facing away from the semiconductor die that remains at least partly uncovered by the mold compound. The first and second terminals of the semiconductor package are connected to different ones of the electrically conductive regions of the substrate.

According to an embodiment of a method of manufacturing a semiconductor package, the method comprises: applying a die attach material to a first main surface of a semiconductor die, the semiconductor die also having an opposing second main surface, an edge disposed perpendicular to the first and second main surfaces, a first electrode at the first main surface, and a second electrode at the second main surface; rotating the semiconductor die so that the first main surface of the semiconductor die faces a first terminal; attaching the first electrode to the first terminal via the die attach material applied to the first main surface; applying a die attach material to the second main surface of the semiconductor die; rotating the semiconductor die with the first terminal attached so that the second main surface of the semiconductor die faces a second terminal; and attaching the second electrode to the second terminal via the die attach material applied to the second main surface.

According to another embodiment of a method of manufacturing a semiconductor package, the method comprises: applying a die attach material to a first main surface of a semiconductor die and to an opposing second main surface of the semiconductor die, the semiconductor die further having an edge disposed perpendicular to the first and second main surfaces, a first electrode at the first main surface, and a second electrode at the second main surface; inserting the semiconductor die with the die attach materials into a gap between first and second terminals; and attaching the first electrode to the first terminal via the die attach material applied to the first main surface and the second electrode to the second terminal via the die attach material applied to the second main surface after the semiconductor die is inserted into the gap between first and second terminals.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings:

FIGS. 2A and 2B illustrate perspective views of opposing main surfaces of a semiconductor die included in the package of FIG. 1;

FIG. 3 illustrates a cross-sectional view of a small footprint semiconductor package according to another embodiment;

FIGS. 4A through 4C illustrate cross-sectional views of a small footprint semiconductor package during different stages of assembly on a substrate;

FIGS. 5A through 5C illustrate cross-sectional views of different embodiments of a small footprint semiconductor package;

FIGS. 6A through 6C illustrate two opposing cross-sectional views (FIGS. 6A and 6B) and one corresponding perspective view (FIG. 6C) of a small footprint semiconductor package during insertion into a slot on a substrate;

FIGS. 7A through 7C illustrate bottom (FIG. 7A) and top (FIGS. 7B and 7C) perspective views of a small footprint semiconductor package according to two different embodiments;

FIGS. 8A and 8B illustrate cross-sectional views of a small footprint semiconductor package according to yet another embodiment;

FIGS. 9A and 9B illustrate different side perspective views of a small footprint semiconductor package with cooling structures on one or more terminals of the package;

FIG. 11, which includes FIG. 11A through 11E, illustrates an embodiment of a method of manufacturing a small footprint semiconductor package; and FIG. 12, which includes FIG. 12A through 12C, illustrates another embodiment of a method of manufacturing a small footprint semiconductor package.

DETAILED DESCRIPTION

Embodiments described herein provide a semiconductor package for mounting to a PCB or other type of substrate so that a semiconductor die included in the package is mounted with its edge facing the substrate instead of either main surface of the die facing the substrate. Such a configuration yields a small package footprint and greater heat dissipation at both main surfaces of the die. Various embodiments described next pertain to the semiconductor package itself, a semiconductor assembly including such a package and methods of manufacturing the package. The semiconductor die included in the package can be any type of semiconductor die such as an IGBT (insulated gate bipolar transistor) die, power MOSFET (metal oxide semiconductor field effect transistor) die, JFET (junction field effect transistor) die, GaN die, SiC die, thyristor die, power diode die, power integrated circuit, etc. The semiconductor die typically has a current flow path from one of the electrodes at one main surface of the die to another electrode at the opposing main surface of the die. The semiconductor package can be used with other semiconductor packages and components mounted on the same or different substrate to form any type of desired circuit such as a half-bridge, full-bridge or 3-phase circuit, etc.

Figure 1:
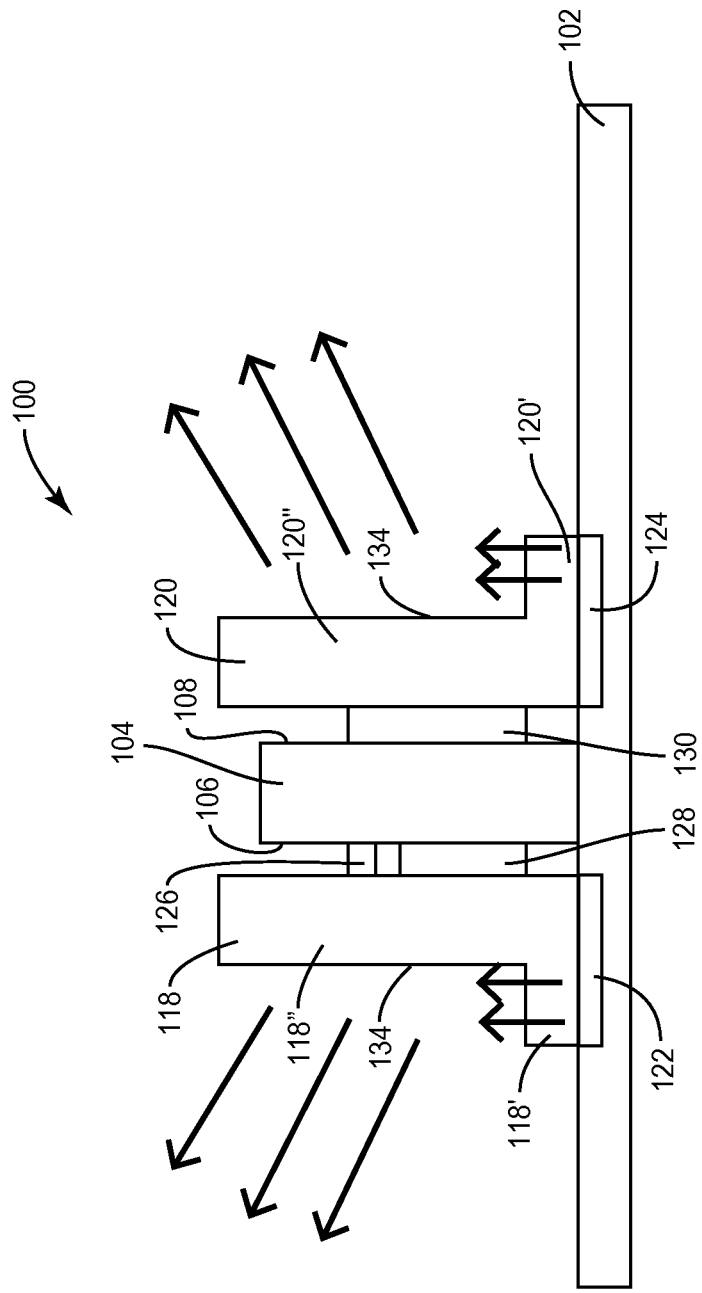
FIG. 1 illustrates a cross-sectional view of a small footprint semiconductor package attached to a substrate.

FIG. 1 illustrates a cross-sectional view of a semiconductor package 100 mounted, soldered or otherwise attached to a substrate 102 such as a PCB or laminate, a ceramic material with top and bottom metallized surfaces, leads of a lead frame, etc. The semiconductor package 100 includes a semiconductor die 104 e.g. of the kind previously described herein. The die 104 has opposing first and second main surfaces 106, 108, an edge 110 disposed perpendicular to the first and second main surfaces 106, 108, at least one electrode 112, 114 at the first main surface 106, and at least one second electrode 116 at the second main surface 108. In the case of a diode die, an anode electrode 114 is disposed at one main surface 106 of the die 104 and a cathode electrode 116 is disposed at the opposing main surface 108. In the case of a power transistor die 104, a gate electrode 112 and the source (emitter) electrode 114 are disposed at the first main surface 106 of the die 104 and the drain (collector) electrode 116 is disposed at the opposing main surface 108. The edge 110 of the die 104 is free of electrodes.

FIG. 2A shows the first main surface 106 of the die 104 that faces one or more corresponding terminals 118 at this side of the package 100, and FIG. 2B shows the second (opposing) main surface 108 of the die that faces one or more corresponding terminals 120 at the opposing side of the package 100. The main die surface 106 shown in FIG. 2A includes the gate and source electrodes 112, 114 of a transistor die 104. The opposing die surface 108 shown in FIG. 2B includes the drain electrode 116 of the transistor die 104. The package 100 includes three terminals 118, 120 according to this embodiment: two terminals 118 at the first main surface 106 of the die 104 for contacting the gate and source electrodes 112, 114 and one terminal 120 at the second (opposing) main surface 108 for contacting the drain electrode 116. Of course, other terminal configurations are possible depending on the type of die and electrode configuration for the die as described above. The gate terminal is hidden behind the source terminal 118 and therefore out of view in FIG. 1.

The electrodes 112, 114, 116 can be metal pads or other types of structures typically disposed on the surface 106, 108 of a semiconductor die 104 for making electrical contact to the die 104. The package terminals 118, 120 can be metal clips or other types of structures typically used to contact the electrodes 112, 114, 116 of a die 104. As shown in FIG. 1, the package terminals 118, 120 can be L-shaped with a base region 118'/120' and an extension region 118"/120" vertically extending from the respective base region 118'/120'. The base region 118'/120' of each terminal 118, 120 is connected to a corresponding electrically conductive region 122, 124 of the substrate 102 e.g. traces of a PCB, patterned metallizations on a ceramic material, leads of a lead frame, etc.

The electrodes 112, 114, 116 of the die 104 are soldered or otherwise attached to the corresponding terminals 118, 120 via die attach material 126, 128, 130 such as solder paste to form the package 100. The semiconductor package 100 is then mounted, soldered or otherwise attached to the substrate 102 to form a semiconductor assembly as shown in FIG. 1. The edge 110 of the semiconductor die 104 included in the package 100 faces the substrate 102 and the terminals 118, 120 of the package 100 are connected to different ones of the electrically conductive regions 122, 124 of the substrate 102. This way, the package 100 has a very small footprint owing to the edge-down mounting configuration. In addition the primary heat dissipation path for the package 100 is not through the substrate 102, but rather through the terminals 118, 120 on both sides of the package 100 as indicated by the arrows shown in FIG. 1. The semiconductor assembly can include additional ones of the same or different semiconductor packages and other active and/or passive components such as inductors, capacitors, transformers, power supplies, etc. mounted to the substrate to form a circuit.

FIG. 3 illustrates a cross-sectional view of another embodiment of the semiconductor package 100, prior to substrate attachment. The embodiment illustrated in FIG. 3 is similar to the one illustrated in FIG. 1, however, the terminals 118, 120 of the package 100 are not L-shaped. Instead, the package terminals 118, 120 have a uniform cross-sectional area (A) over the entire length (L) of each terminal 118, 120.

FIGS. 4A through 4C show cross-sectional views of the semiconductor package 100 of FIG. 3 during subsequent processes, including molding and attachment to a package 102. In FIG. 4A, a mold compound 132 such as silicone, epoxy, etc. encloses or encapsulates at least part of the semiconductor die 104 and the terminals 118, 120 so that the exterior or outer side 134 of each terminal 118, 120 that is parallel with and faces away from the semiconductor die 104 remains at least partly uncovered by the mold compound 132. Heat dissipation by the package 100 is increased by leaving the exterior or outer side 134 of each terminal 118, 120 at least partly uncovered by the mold compound 132.

Further according to this embodiment, a protrusion 136 is formed from the mold compound 132. The protrusion 136 is disposed between the terminals 118, 120 and extends (e) outward further than the terminals 118, 120 at the same side of the semiconductor package 100. Also according to this embodiment, the semiconductor die 104 is enclosed within an air cavity 138 formed by the mold compound 132 and the terminals 118, 120. Alternatively, the mold compound 132 can fill all open gaps between the terminals 118, 120 and the die 104 so that the die 104 is fully encased (covered) by the mold compound 132. In either case, the exterior or outer side 134 of each terminal 118, 120 that is parallel with and faces away from the semiconductor die 104 remains at least partly uncovered by the mold compound 132.

FIG. 4B shows a cross-sectional view of a substrate 102 designed to receive the semiconductor package 100 which has a protrusion 136 formed from the mold compound 132. According to this embodiment, the substrate 102 has a groove 140 for receiving the protrusion 136. Also, the electrically conductive regions 122, 124 of the substrate 102 which are to be subsequently connected to the terminals 118, 120 of the package 100 are disposed on a top surface 142 of the substrate 102.

FIG. 4C shows a cross-sectional view of the resulting assembly after the protrusion 136 of the package 100 is inserted into and received by the groove 140 formed in the substrate 102 in a press-fit type of connection as indicated by the oval labeled 'Press-Fit Connection' in FIG. 4C. The at least partly uncovered exterior or outer side 134 of each terminal 118, 120 is pressed, e.g. via an elastic or spring force, against a side 123, 125 of the corresponding electrically conductive region 122, 124 of the substrate 102 that is perpendicular to the top surface 142 of the substrate 102 as indicated by the oval labeled 'Abutting Connection' in FIG. 4C. The terminals 118, 120 of the package 100 can be soldered to the corresponding electrically conductive region 122, 124 of the substrate 102 to yield a more permanent connection between the package 100 and substrate 102.

FIGS. 5A through 5C show cross-sectional views of yet additional embodiments of the semiconductor package 100, prior to molding. In FIG. 5A, the edge 110 of the semiconductor die 104 is flush with the terminals 118, 120 at the end 119, 121 of the terminals 118, 120 to be mounted to a substrate. In FIG. 5B, part of the semiconductor die 104 extends (e) outward further than the terminals 118, 120 at the side 119, 121 of the terminals 118, 120 to be mounted to a substrate. According to this embodiment, the part of the semiconductor die 104 that extends outward further than the terminals 118, 120 forms a protrusion 105 designed to be received by a groove formed in the substrate e.g. such as the groove 140 shown in FIG. 4B. In FIG. 5C, the edge 110 of the semiconductor die 104 is not flush with either end of the terminals 118, 120 as shown in FIG. 5A nor does the die edge 110 extend beyond either end of the terminals 118, 120 as shown in FIG. 5B.

FIGS. 6A and 6B show perspective views of the vertical sides 101, 103 of the semiconductor package 100. In this embodiment, the semiconductor die 104 is a power transistor die and the package 100 includes gate and source (or emitter) terminals 200, 204 at one vertical side 101 of the package 100 for connecting to the corresponding gate and source (or emitter) electrodes 112, 114 of the die 104, and a drain (or collector) terminal 204 at the opposing vertical side 103 of the package 100 for connecting to the drain (or collector) electrode 116 of the die 104. The die 104 is covered by a mold compound 132 in FIGS. 6A and 6B and therefore out of view. The location of the source (emitter) and drain (collector) terminals 202, 204 can be switched. FIG. 6A shows the side 101 of the package 100 with the gate and source (or emitter) terminals 200, 202, and FIG. 6B shows the opposing side 103 of the package 100 with the drain (or collector) terminal 204. According to this embodiment, the edge of each vertical side 101, 103 of the package 100 is covered by the mold compound 132 and the exterior or outer side 134 of each terminal 200, 202, 204 that is parallel with and faces away from the semiconductor die 104 remains at least partly uncovered by the mold compound 132.

Further according to this embodiment, each of the package terminals 200, 202, 204 has one or more contact pads 206 disposed at one end of the at least partly uncovered side 134 of each terminal 200, 202, 204. The contact pads 206 are designed to contact corresponding contacts pads 208 included in a slot 210 disposed on the surface of a substrate to which the semiconductor package 100 is to be inserted. FIGS. 6A and 6B also show cross-sectional views of the corresponding sides of the slot 210. The slot 210 has a base 212 and an open region 214 with opposing interior sides 211, 213 for receiving the package 100. Each interior side 211, 213 of the slot 210 has contact pads 208 designed to make contact with the corresponding pads 206 of the package terminal(s) 200/202/204 abutting that side 211, 213 of the slot 210 upon insertion of the package 100 in the slot 210. The package insertion direction is indicated by a downward-facing arrow in FIGS. 6A and 6B. FIG. 6C shows a perspective view of the side 101 of the package 100 with the gate and source (or emitter) terminals 200, 202 after insertion into the slot 210 of the substrate. The substrate is not shown in FIGS. 6A through 6C for ease of illustration, but can be any type of substrate previously described herein.

FIG. 7A shows a bottom plan view of the semiconductor package 100 according to an embodiment. The terminals 200, 202, 204 remain uncovered by the mold compound 132 at the bottom side of the package 100 i.e. the side of the package 100 to be attached to a substrate.

FIG. 7B shows a top plan view of the semiconductor package 100 according to an embodiment. According to this embodiment, the terminals 200, 202, 204 also remain uncovered by the mold compound 132 at the top side of the package 100 i.e. the side of the package 100 facing away from the substrate.

FIG. 7C shows a top plan view of the semiconductor package 100 according to an alternative embodiment, where the terminals 200, 202, 204 are covered by the mold compound 132 at the top side of the package 100. In each case, the exterior or outer side 134 of each terminal 200, 202, 204 that is parallel with and faces away from the semiconductor die 104 remains at least partly uncovered by the mold compound 132. The semiconductor package 100 can be surface mounted on a substrate according to this embodiment.

FIGS. 8A and 8B show cross-sectional views of the semiconductor package 100 according to another embodiment, prior to molding (FIG. 8A) and after molding (FIG. 8B). According to this embodiment, each terminal 118, 120 has a first end 119, 121 with a groove 300 and an opposing second end 301, 303 with a groove 300. The mold compound 132 fills the grooves 300 at both ends 119/121, 301,303 of the terminals 118, 120 after the molding process as shown in FIG. 8B.

FIGS. 9A and 9B show views of the semiconductor package 100 according to still another embodiment. FIG. 9A shows a first side perspective view of the package 100 looking at the lateral sides of the package terminals 118, 120, and FIG. 9B shows a second side perspective view of the package 100 looking at the main sides of the terminals 118, 120. The mold compound 132 is not shown in FIGS. 9A and 9B for ease of illustration. According to this embodiment, cooling structures 400 are patterned into the exterior or outer side 134 of one or more of the terminals 118, 120 that is parallel with and faces away from the semiconductor die 104. The cooling structures 400 increase the exposed surface area of the terminal 118/120, improving the heat dissipation characteristics of the package 100. In the case of copper terminals 118, 120, the cooling structures 400 can be etched into the at least partly uncovered side 134 of the terminals 118, 120 to include a pre-form or post-form leadframe or clip with such structures. In the case of aluminum terminals 118, 120, the cooling structures 400 can be formed by extrusion. In one embodiment, the cooling structures 400 are fin-type structures patterned into the exterior or outer side 134 of one or more of the terminals 118, 120 that is parallel with and faces away from the semiconductor die 104. The fins can have any type of shape e.g. rectangular, triangular, etc. Other cooling structure shapes can be used instead such as cylindrical or pin-shaped cooling structures.

Figure 10B:
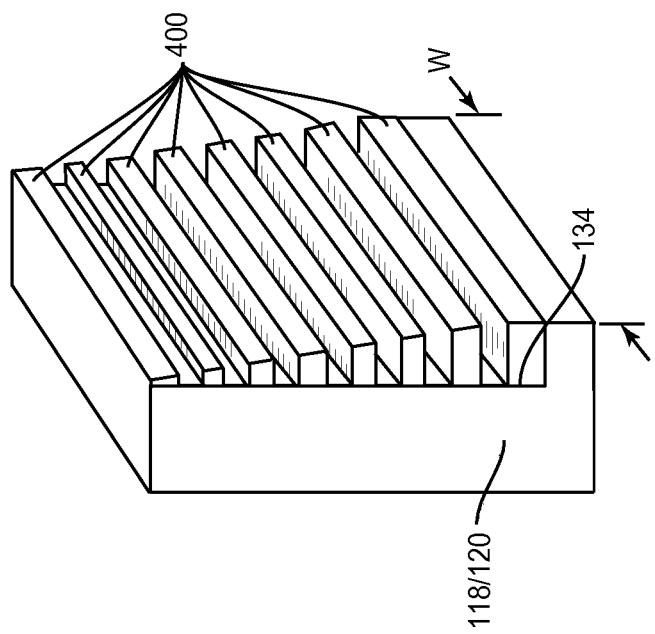
FIGS. 10A and 10B illustrate different side perspective views of a small footprint semiconductor package with fin-type cooling structures on one or more terminals of the package.
Figure 10A:
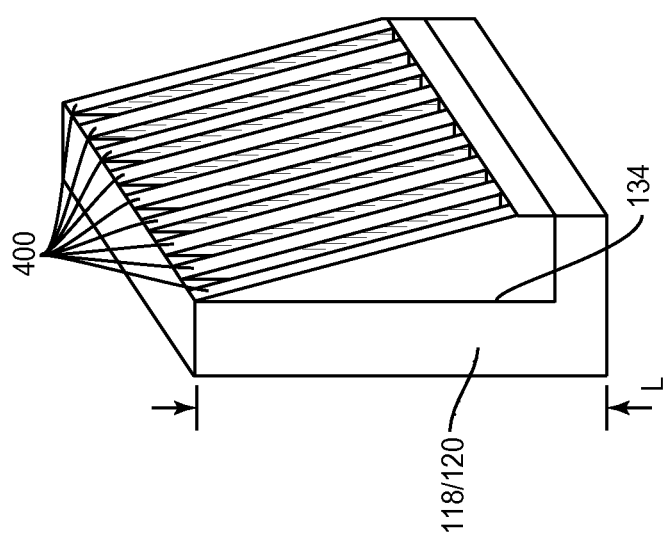

FIGS. 10A and 10B show perspective views of one of the package terminals 118/120 with fin-type cooling structures 400, according to different embodiments. In the embodiment of FIG. 10A, the fin-type cooling structures 400 extend along the length (L) of the exterior or outer side 134 of the terminal 118/120 that is parallel with and faces away from the semiconductor die 104. In the embodiment of FIG. 10B, the fin-type cooling structures 400 extend along the width (W) of the exterior or outer side 134 of the terminal 118/120 that is parallel with and faces away from the semiconductor die 104. In both cases air flows across the fins, enabling the package 100 to dissipate more heat.

FIG. 11 illustrates an embodiment of a method of manufacturing the semiconductor package 100 described herein. A semiconductor die 104 and terminals 118, 120 for connection to the die 100 are provided (FIG. 11A). The die 104 has opposing first and second main surfaces 106, 108, an edge 110 disposed perpendicular to the main surfaces 106, 108, one or more electrodes at the first main surface 106 and one or more electrodes at the second main surface 108. The die electrodes are out of view in FIG. 11.

Continuing with the manufacturing method, a die attach material 126, 128 such as solder paste is applied to the first main surface 106 of the die 104 on the corresponding electrode(s) (FIG. 11B). The die 104 is then rotated so that the first main surface 106 of the die 104 faces each terminal 118 to be connected to the first main surface 106 (FIG. 11C). Each terminal 118 facing the first main surface 106 of the die 104 is attached to the corresponding electrode via the die attach material 126, 128 applied to the first main surface 106 e.g. by reflowing the die attach material 126, 128 in the case of solder paste (FIG. 11C). A die attach material 130 such as solder paste is applied to the second main surface 108 of the die 104 on the corresponding electrode(s) (FIG. 11D), and the die 104 is rotated with the previously attached terminal (s) 118 so that the second main surface 108 of the die 104 faces each terminal 120 to be connected to the second main surface 108 (FIG. 11E). Each terminal 120 facing the second main surface 108 of the die 104 is then attached to the corresponding electrode via the die attach material 130 applied to the second main surface 108 e.g. by reflowing the die attach material 108 in the case of solder paste (FIG. 11E). The manufacturing method can further include enclosing at least part of the semiconductor die 104 and terminals 118, 120 with a mold compound 132 so that each of the terminals 118, 120 has a side 134 parallel with and facing away from the semiconductor die 104 that remains at least partly uncovered by the mold compound 132. The manufacturing method can further include forming a protrusion 136 from the mold compound 132 that is disposed between the terminals 118, 120 and extends outward further than the terminals 118, 120 at the same side of the semiconductor package 100.

FIG. 12 illustrates another embodiment of a method of manufacturing the semiconductor package 100 described herein. A semiconductor die 104 and terminals 118, 120 for connection to the die 104 are provided (FIG. 12A). The die 104 has opposing first and second main surfaces 106, 108, an edge 110 disposed perpendicular to the main surfaces 106, 108, one or more electrodes 112, 114 at the first main surface 106 and one or more electrodes at the second main surface 108. The die electrodes are out of view in FIG. 12.

Continuing with the manufacturing method, a die attach material 126, 128, 130 such as solder paste is applied to both main surfaces 106, 108 of the die 104 on the electrodes (FIG. 12B). The semiconductor die 104 with the die attach material 1126, 128, 130 on both surfaces 106, 108 is then inserted into a gap between the terminals 118, 120 as indicated by the downward facing arrow in FIG. 12B. The electrode(s) at the first main surface 106 of the die 104 are attached to the corresponding terminal(s) 118 adjacent the first main surface 106 via the die attach material 126, 128 applied to the first main surface, and the electrode(s) at the second main surface 108 of the die 104 are attached to the corresponding terminal (s) 120 adjacent the second main surface 108 via the die attach material 130 applied to the second main surface 108 (FIG. 12C). The manufacturing method can further include enclosing at least part of the semiconductor die 104 and terminals 118, 120 with a mold compound 132 so that each of the terminals 118, 120 has a side 134 parallel with and facing away from the die 104 that remains at least partly uncovered by the mold compound 132. The manufacturing method can further include forming a protrusion 136 from the mold compound 132 that is disposed between the terminals 118, 120 and extends outward further than the terminals 118, 120 at the same side of the semiconductor package 100.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
   a semiconductor die having opposing first and second main surfaces, an edge disposed perpendicular to the first and second main surfaces, a first electrode at the first main surface, and a second electrode at the second main surface;
   a first terminal attached to the first electrode;
   a second terminal attached to the second electrode;
   a mold compound enclosing at least part of the semiconductor die and the first and second terminals so that each of the first and second terminals has a side parallel with and facing away from the semiconductor die that remains at least partly uncovered by the mold compound; and
   a protrusion formed from the mold compound or protruding out of the mold compound, the protrusion disposed between the first and second terminals and extending outward further than the first and second terminals at the same side of the semiconductor package,
   wherein the protrusion comprises a different material than the first and second terminals.

2. The semiconductor package of claim 1, wherein the protrusion comprises part of the semiconductor die so that the semiconductor die extends outward further than the first and second terminals at the same side of the semiconductor package.

3. The semiconductor package of claim 1, wherein the semiconductor die is a power transistor die, the first electrode is a source electrode of the power transistor die, the second electrode is a drain electrode of the power transistor die, and the power transistor die further has a gate electrode at the same surface of the die as the source electrode or the drain electrode, the semiconductor package further comprising:
   a third terminal attached to the gate electrode,
   wherein the mold compound encloses at least part of the third terminal so that the third terminal has a side parallel with and facing away from the semiconductor die that remains at least partly uncovered by the mold compound, and the protrusion extends outward further than the third terminal at the same side of the semiconductor package as the first and second terminals.

4. The semiconductor package of claim 1, wherein the semiconductor die is enclosed within an air cavity formed by the mold compound and the terminals.

5. The semiconductor package of claim 1, further comprising cooling structures patterned into the at least partly uncovered side of at least one of the first and second terminals for increasing the surface area of that side.

6. The semiconductor package of claim 1, wherein each of the first and second terminals has one or more contact pads disposed at an end of the at least partly uncovered side of the respective terminals.

7. The semiconductor package of claim 1, wherein the first and second terminals have a uniform cross-sectional area over the entire length of each terminal.

8. The semiconductor package of claim 1, wherein the edge of the semiconductor die is flush with the first and second terminals at one end of the terminals.

9. The semiconductor package of claim 1, wherein the first and second terminals each have a first end covered by the mold compound and an opposing second end at least partly uncovered by the mold compound.

10. The semiconductor package of claim 1, wherein the first and second terminals each have a first end with a groove and an opposing second end with a groove, and wherein the mold compound fills the grooves at the first end of the terminals and the grooves at the second end of the terminals.

11. A semiconductor package, comprising:
    a semiconductor die having opposing first and second main surfaces, an edge disposed perpendicular to the first and second main surfaces, a first electrode at the first main surface, and a second electrode at the second main surface;
    a first terminal attached to the first electrode;
    a second terminal attached to the second electrode;
    a mold compound enclosing at least part of the semiconductor die and the first and second terminals so that each of the first and second terminals has a side parallel with and facing away from the semiconductor die that remains at least partly uncovered by the mold compound; and
    cooling structures patterned into the at least partly uncovered side of at least one of the first and second terminals for increasing the surface area of that side.

12. The semiconductor package of claim 11, wherein the cooling structures comprise fin-type structures patterned into the at least partly uncovered side of at least one of the first and second terminals.

13. The semiconductor package of claim 12, wherein the fin-type structures extend along the width of the at least partly uncovered side with the cooling structures.

14. The semiconductor package of claim 11, further comprising a protrusion formed from the mold compound or protruding out of the mold compound, the protrusion disposed between the first and second terminals and extending outward further than the first and second terminals at the same side of the semiconductor package.

15. A semiconductor assembly, comprising:
    a substrate having electrically conductive regions; and
    a semiconductor package, comprising:
      a semiconductor die having opposing first and second main surfaces, an edge disposed perpendicular to the first and second main surfaces, a first electrode at the first main surface, and a second electrode at the second main surface;
      a first terminal attached to the first electrode;
      a second terminal attached to the second electrode; and a mold compound enclosing at least part of the semiconductor die and the first and second terminals so that each of the first and second terminals has a side parallel with and facing away from the semiconductor die that remains at least partly uncovered by the mold compound, wherein the first and second terminals of the semiconductor package are connected to different ones of the electrically conductive regions of the substrate, wherein the semiconductor package further comprises a protrusion formed from the mold compound or protruding out of the mold compound, the protrusion disposed between the first and second terminals and extending outward further toward the substrate than the first and second terminals, wherein the protrusion is received by a groove in the substrate, wherein the protrusion comprises a different material than the first and second terminals.

16. The semiconductor assembly of claim 15, wherein the first and second terminals of the semiconductor package have a uniform cross-sectional area over the entire length of each terminal, wherein the electrically conductive regions of the substrate connected to the first and second terminals are disposed on a surface of the substrate, and wherein the at least partly uncovered side of each terminal is pressed against a side of the corresponding electrically conductive region that is perpendicular to the surface of the substrate.

17. The semiconductor assembly of claim 15, wherein the protrusion comprises part of the semiconductor die so that the semiconductor die extends outward further than the first and second terminals and is received by the groove in the substrate.

18. The semiconductor assembly of claim 15, wherein the semiconductor die is a power transistor die, the first electrode is a source electrode of the power transistor die, the second electrode is a drain electrode of the power transistor die, and the power transistor die further has a gate electrode at the same surface of the die as the source electrode or the drain electrode, the semiconductor package further comprising:
a third terminal attached to the gate electrode and connected to one of the electrically conductive regions of the substrate, wherein the mold compound encloses at least part of the third terminal so that the third terminal has a side parallel with and facing away from the semiconductor die that remains at least partly uncovered by the mold compound, and the protrusion extends outward further toward the substrate than the third terminal.

19. The semiconductor assembly of claim 15, wherein the semiconductor die is enclosed within an air cavity formed by the mold compound and the terminals.

20. The semiconductor assembly of claim 15, wherein each of the first and second terminals has one or more contact pads disposed at an end of the at least partly uncovered side of the respective terminals, wherein the electrically conductive regions of the substrate connected to the first and second terminals each comprise a slot with contact pads, and wherein each of the terminals is inserted in the corresponding slot so that each contact pad of the terminal contacts one of the contact pads of the slot.

21. The semiconductor assembly of claim 15, wherein the edge of the semiconductor die is flush with the first and second terminals at an end of the terminals adjacent the substrate.

22. The semiconductor assembly of claim 15, wherein the first and second terminals each have a first end covered by the mold compound and an opposing second end at least partly uncovered by the mold compound, the first end of the terminals facing away from the substrate and the second end of the terminals facing the substrate.

23. The semiconductor assembly of claim 15, wherein the first and second terminals each have a first end with a groove and an opposing second end with a groove, and wherein the mold compound fills the grooves at the first end of the terminals and the grooves at the second end of the terminals.

24. The semiconductor assembly of claim 15, further comprising cooling structures patterned into the at least partly uncovered side of at least one of the first and second terminals for increasing the surface area of that side.

25. The semiconductor assembly of claim 24, wherein the cooling structures comprise fin-type structures patterned into the at least partly uncovered side of at least one of the first and second terminals.

26. The semiconductor assembly of claim 25, wherein the fin-type structures extend along the width of the at least partly uncovered side with the cooling structures.

* * * * *